| (12) | United States Patent | (10) Patent No.: | US 9,702,901 B2 |
|---|---|---|---|
| | Nakamura et al. | (45) Date of Patent: | Jul. 11, 2017 |

(54) TEST CARRIER

(71) Applicant: ADVANTEST CORPORATION, Tokyo (JP)

(72) Inventors: Kiyoto Nakamura, Miyagi (JP); Kazuo Takano, Saitama (JP); Noriyuki Masuda, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 250 days.

(21) Appl. No.: 14/405,064

(22) PCT Filed: May 27, 2013

(86) PCT No.: PCT/JP2013/064608
§ 371 (c)(1),
(2) Date: Dec. 2, 2014

(87) PCT Pub. No.: WO2013/183479
PCT Pub. Date: Dec. 12, 2013

(65) Prior Publication Data
US 2015/0130492 A1 May 14, 2015

(30) Foreign Application Priority Data

Jun. 5, 2012 (JP) ................................. 2012-128164

(51) Int. Cl.
*G01R 31/00* (2006.01)
*G01R 1/04* (2006.01)
*G01R 31/28* (2006.01)

(52) U.S. Cl.
CPC ............. *G01R 1/04* (2013.01); *G01R 1/0483* (2013.01); *G01R 31/2886* (2013.01)

(58) Field of Classification Search
CPC .. G01R 1/0408; G01R 1/0433; G01R 1/0483; G01R 1/07314; G01R 31/26; G01R 31/2808; G01R 31/2886
See application file for complete search history.

(56) References Cited

U.S. PATENT DOCUMENTS

| 5,757,199 A | 5/1998 | Maruyama |
| 5,828,224 A | 10/1998 | Maruyama |
| 5,986,459 A | 11/1999 | Fukaya et al. |

(Continued)

FOREIGN PATENT DOCUMENTS

| JP | 5-299148 A | 11/1993 |
| JP | 7-263504 A | 10/1995 |

(Continued)

OTHER PUBLICATIONS

Office Action issued in Japan Counterpart Patent Appl. No. 2014-519928, dated Sep. 15, 2015.

(Continued)

*Primary Examiner* — Tung X Nguyen
(74) *Attorney, Agent, or Firm* — Greenblum & Bernstein, P.L.C.

(57) ABSTRACT

A test carrier includes a base member that holds a die and a cover member. The base member includes a board having a wiring line that is electrically connected to the die. The wiring line includes a wiring line and a resistive portion having a resistance value that is higher than the resistance value of the wiring line.

8 Claims, 5 Drawing Sheets

(56) References Cited

U.S. PATENT DOCUMENTS

| | | | | |
|---|---|---|---|---|
| 6,091,310 A | * | 7/2000 | Utsumi | H01L 23/645 174/262 |
| 6,639,416 B1 | * | 10/2003 | Akram | G01R 1/0483 324/756.05 |
| 2006/0255813 A1 | * | 11/2006 | Rispoli | G01R 31/2812 324/691 |
| 2011/0261536 A1 | | 10/2011 | Feichtinger et al. | |
| 2011/0273202 A1 | | 11/2011 | Kim et al. | |

FOREIGN PATENT DOCUMENTS

| | | |
|---|---|---|
| TW | 201141318 A | 11/2011 |
| WO | WO 2006/028238 | 3/2006 |

OTHER PUBLICATIONS

Korean Office action, mail date is Mar. 30, 2015.
U.S. Appl. No. 14/405,054 to Kiyoto Nakamura, filed Dec. 2, 2014.
Search report from International Patent Appl. No. PCT/JP2013/064608, mail date is Aug. 27, 2013.
TW OA 10321190000 Office action, mail date is Aug. 27, 2014.

\* cited by examiner

TEST CARRIER

TECHNICAL FIELD

The present invention relates to a test carrier that is mounted with a die chip, in order to test an electronic circuit, such as an integrated circuit, formed on a die chip.

For the designated countries which permit the incorporation by reference, the content described and/or illustrated in Japanese Patent Application No. 2012-128164 filed on Jun. 5, 2012 is incorporated by reference in the present application as a part of the description and/or drawing of the present application.

BACKGROUND ART

As a test carrier on which a semiconductor chip in a bare chip state is temporarily mounted, a test carrier has been known in which a semiconductor chip in a bare chip state is interposed between a contact sheet and a case. The contact sheet includes a conductive contact pad and a conductive wiring pattern which are formed on a film. The conductive contact pad is formed so as to correspond to an electrode pattern of the chip. The conductive wiring pattern is connected to the contact pad and is used for contact with an external test device (for example, see Patent Document 1).

CITATION LIST

Patent Document

Patent Document 1: JP H07-263504 A

DISCLOSURE OF THE INVENTION

Problem to be Solved by the Invention

In general, when the test carrier is used to test a chip, a chip test device needs to output a signal output for testing each pin. Therefore, when the number of pins increases, the power consumption of the test device is increased by a value corresponding to the increase in the number of pins. In the test carrier, when the signal output corresponding to each pin is large, the power consumption of the test device further increases. However, there is a limitation in the output power of the test device. Therefore, the test carrier according to the related art has a problem that it is difficult to respond to a chip with multiple pins.

An object of the invention is to provide a test carrier which responds to an increase in the number of pins of a chip.

Means for Solving Problem

[1] According to the invention, a test carrier includes a first member that holds an electronic device to be tested and a second member that overlaps the first member so as to cover the electronic device to be tested. The first member includes a board having a wiring line that is electrically connected to the electronic device to be tested. The wiring line includes a first wiring portion that has a first predetermined resistance value and a second wiring portion that has a second resistance value higher than the first resistance value.

[2] In the above-mentioned invention, the second resistance value may be set depending on an upper limit output of a test apparatus that tests the electronic device to be tested and the number of electrical contacts between the electronic device to be tested and the test carrier.

[3] In the above-mentioned invention, the first member may include an external terminal that is electrically connected to one end of the wiring line. The second wiring portion may be formed closer to an electrical contact portion between the electronic device to be tested and the first member than to the external terminal.

[4] According to another invention, a test carrier includes a first member that holds an electronic device to be tested and a second member that overlaps the first member so as to cover the electronic device to be tested. The first member includes a plurality of contact portions that come into electrical contact with the electronic device to be tested. A resistance value of the contact portions is set depending on an upper limit output of a test device that tests the electronic device to be tested and the number of electrical contacts between the electronic device to be tested and the first member.

[5] In the above-mentioned invention, the contact portion may be made of a conductive elastic material and the resistance value may be adjusted by the content of the elastic material.

[6] In above-mentioned invention, the board may be a multi-layer board.

[7] In above-mentioned invention, the board may include a noise suppression portion that suppresses noise.

[8] In the above-mentioned invention, the first member may include an external terminal that is electrically connected to the one end of the wiring line. The noise suppression portion may be formed closer to the electrical contact portion between the electronic device to be tested and the first member than to the external terminal.

Effect of the Invention

According to the invention, even when there are a large number of pins, the multi-layer board makes it possible to increase the density of the wiring lines in a portion close to the electronic device to be tested. Therefore, it is possible to achieve a test carrier which responds to a large number of pins.

MODE(S) FOR CARRYING OUT THE INVENTION

Hereinafter, an embodiment of the invention will be described with reference to the drawings.

Figure 1:
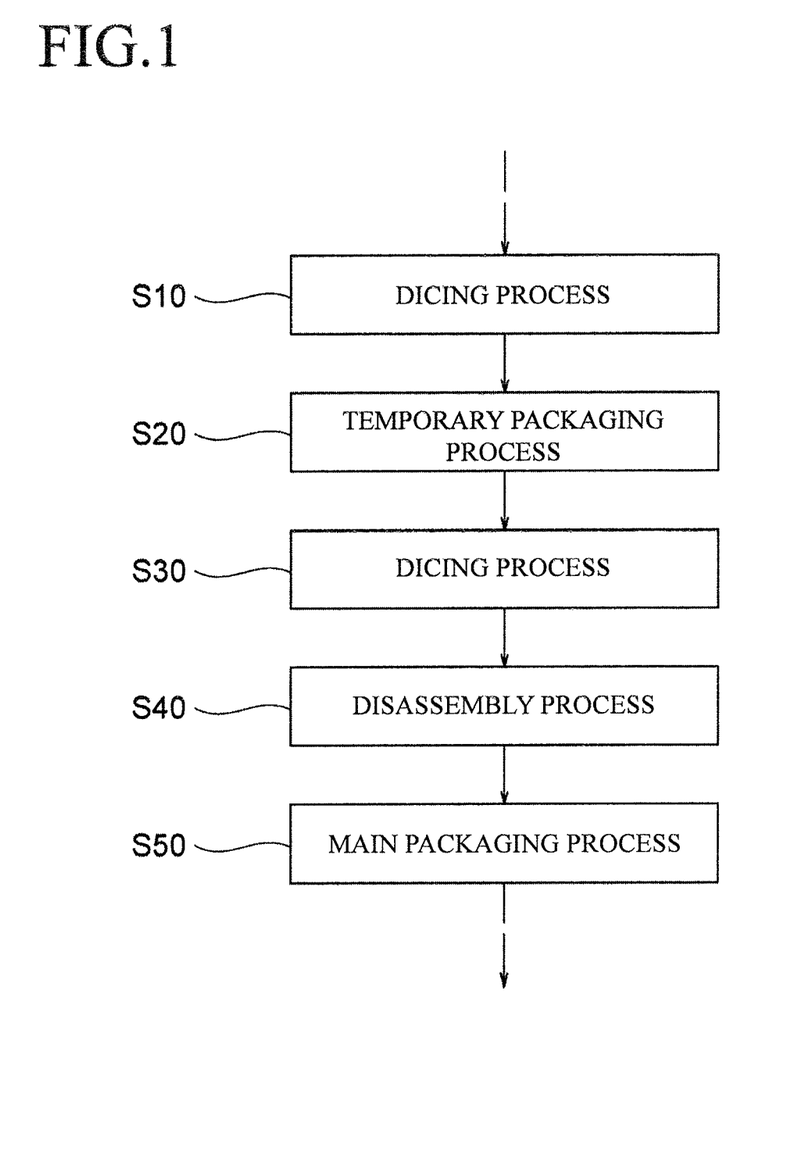
FIG. 1 is a flowchart illustrating a portion of a device manufacturing process in an embodiment of the invention.

FIG. 1 is a flowchart illustrating a portion of a device manufacturing process in the present embodiment.

In the present embodiment, an electronic circuit which is incorporated into a die 90 is tested after a semiconductor wafer is diced (after Step S10 in FIG. 1) and before final packaging is performed (before Step S50) (Steps S20 to S40).

In the present embodiment, first, the die 90 is temporarily mounted on a test carrier 10 by a carrier assembly apparatus (not illustrated) (Step S20). Then, the die 90 is electrically connected to a testing apparatus (not illustrated) via the test carrier 10 and the electronic circuit formed in the die 90 is tested (Step S30). After the test ends, the die 90 is taken out of the test carrier 10 (Step S40) and main packaging is performed on the die 90. In this way, a device is completed as a final product.

Next, the structure of the test carrier 10 on which the die 90 is temporarily mounted (temporarily packaged) in the present embodiment will be described with reference to FIGS. 2 to 9.

FIGS. 2 to 5 are diagrams illustrating the test carrier according to the present embodiment.

Figure 2:
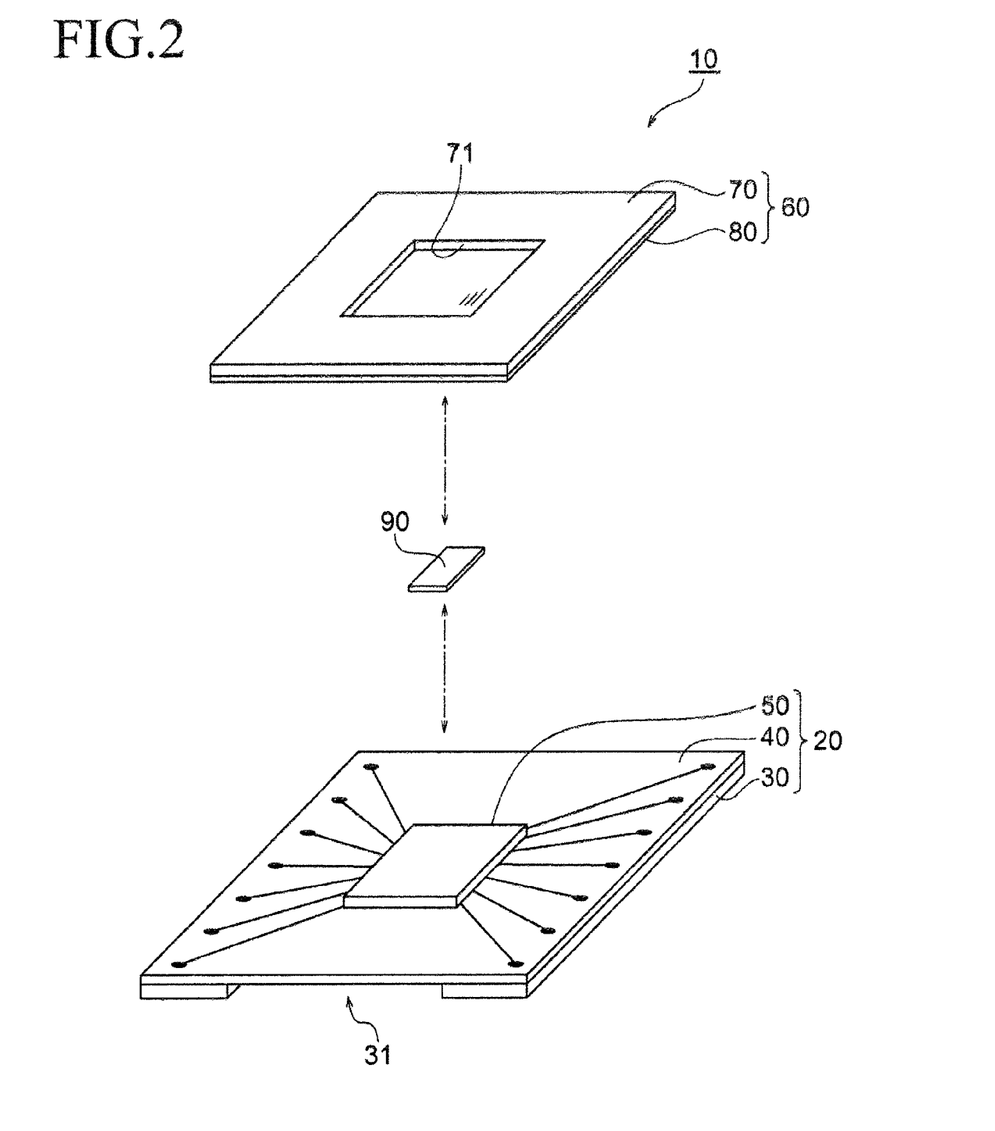
FIG. 2 is an exploded perspective view illustrating a test carrier in the embodiment of the invention.
Figure 3:
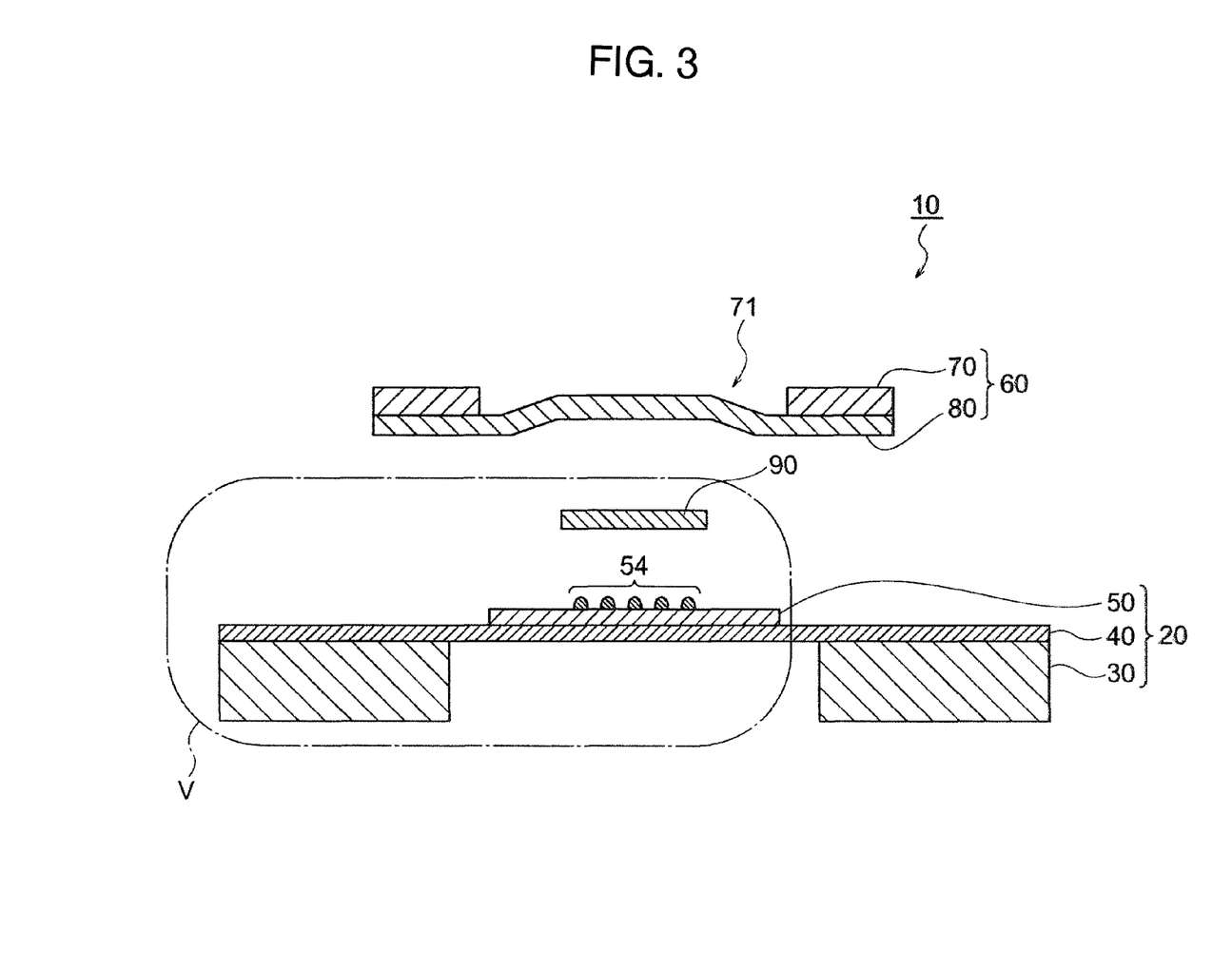
FIG. 3 is a cross-sectional view illustrating the test carrier in the embodiment of the invention.
Figure 4:
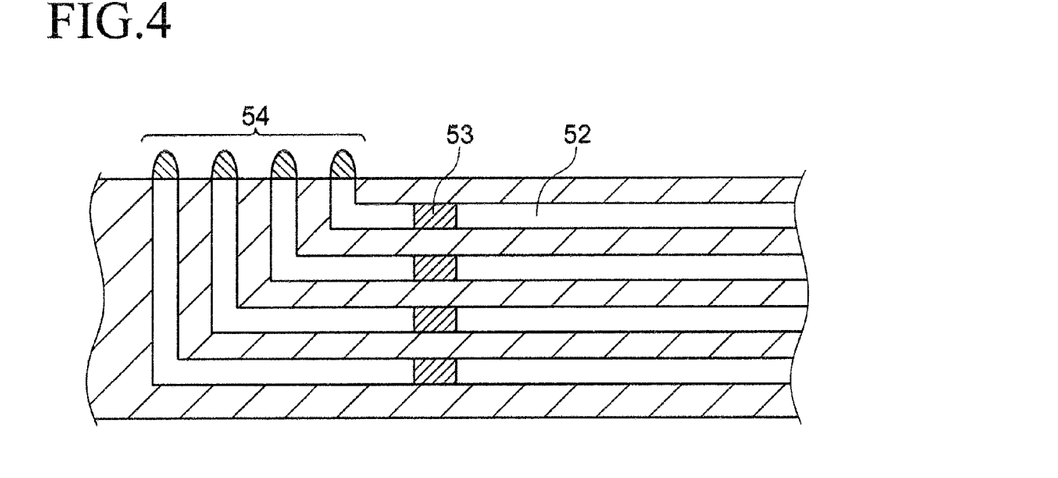
FIG. 4 is a cross-sectional view illustrating a portion of a multi-layer board of the test carrier in the embodiment of the invention.

As illustrated in FIGS. 2 to 4, the test carrier 10 according to the present embodiment includes a base member 20 on which the die 90 is placed and a cover member 60 which overlaps the base member 20 so as to cover the die 90. The die 90 is interposed between the base member 20 and the cover member 60 and the test carrier 10 holds the die 90. The die 90 according to the present embodiment corresponds to an example of an electronic device to be tested in the invention.

The base member 20 includes a base frame 30, a base film 40, and a multi-layer board 50. The base film 40 according to the present embodiment corresponds to an example of a first member in the invention.

The base frame 30 is a rigid board that has high rigidity (has higher rigidity than at least the base film 40) and has an opening 31 formed at the center thereof. As the material forming the base frame a polyimide resin, a polyamide-imide resin, a glass epoxy resin, ceramics, or glass is exemplified.

The base film 40 is a flexible film and is stuck to the entire surface of the base frame 30 including the central opening 31 by an adhesive (not illustrated). In the present embodiment, since the base film 40 with flexibility is stuck to the base frame 30 with high rigidity, the handling ability of the base member 20 is improved.

The base film 40 is also a board that supports the multi-layer board 50.

The base frame 30 may be omitted and the base member 20 may include only the base film 40 and the multi-layer board 50.

The multi-layer board 50 is a board including multiple layers and is stuck to the center of a surface which faces the die 90 among the side surfaces of the base frame 30 through an adhesive (not illustrated). The multi-layer board 50 includes a wiring circuit for electrical connection between a wiring pattern 42 formed in the base film 40 and bumps 54 which becomes a contact with the die 90.

As illustrated in FIG. 2, in the test carrier 10, the die 90 is mounted on a central portion of the side surface of the base film 40. When the number of pins in the die 90 is larger than hundreds, the wiring circuit needs to have a high-density layout in the central portion. Therefore, in the present example, a portion which needs to have high density is formed in a multi-layer structure so as to correspond to the die 90 with a plurality of pins. At the outer edge of the base film 40, a space for forming a wiring layout is larger than that in the central portion. Therefore, the multi-layer board 50 may not be provided at the outer edge of the base frame 30 and the wiring pattern 42 is formed on the surface of the base film 40. That is, the wiring pattern 42 is formed outside the multi-layer board 50, on the surface of the base film 40.

The multi-layer board 50 is formed such that the size of the multi-layer board 50 is larger than the surface of the die 90 and is smaller than an opening 71 formed at the center of a cover frame 70, in a direction along the surface opposite to the die 90. In other words, the multi-layer board 50 is formed such that the area of an opposite surface of the multi-layer board 50 is larger than that of the opposite surface of the die 90 and is less than that of the opposite surface of an opening 71. The opposite surface of the multi-layer board 50 opposite to the cover frame 70 and the die 90.

Since the die 90 is interposed between a cover film 80 which extends to the opening 71 of the cover frame 70 and the multi-layer board 50, wiring density is high therebetween. In general, the multi-layer board 50 is more expensive than the base film 40. Therefore, when the size of the multi-layer board 50 is defined as described above, it is possible to increase the number of pins in the test carrier 10 while suppressing an increase in the costs of the board.

Figure 5:
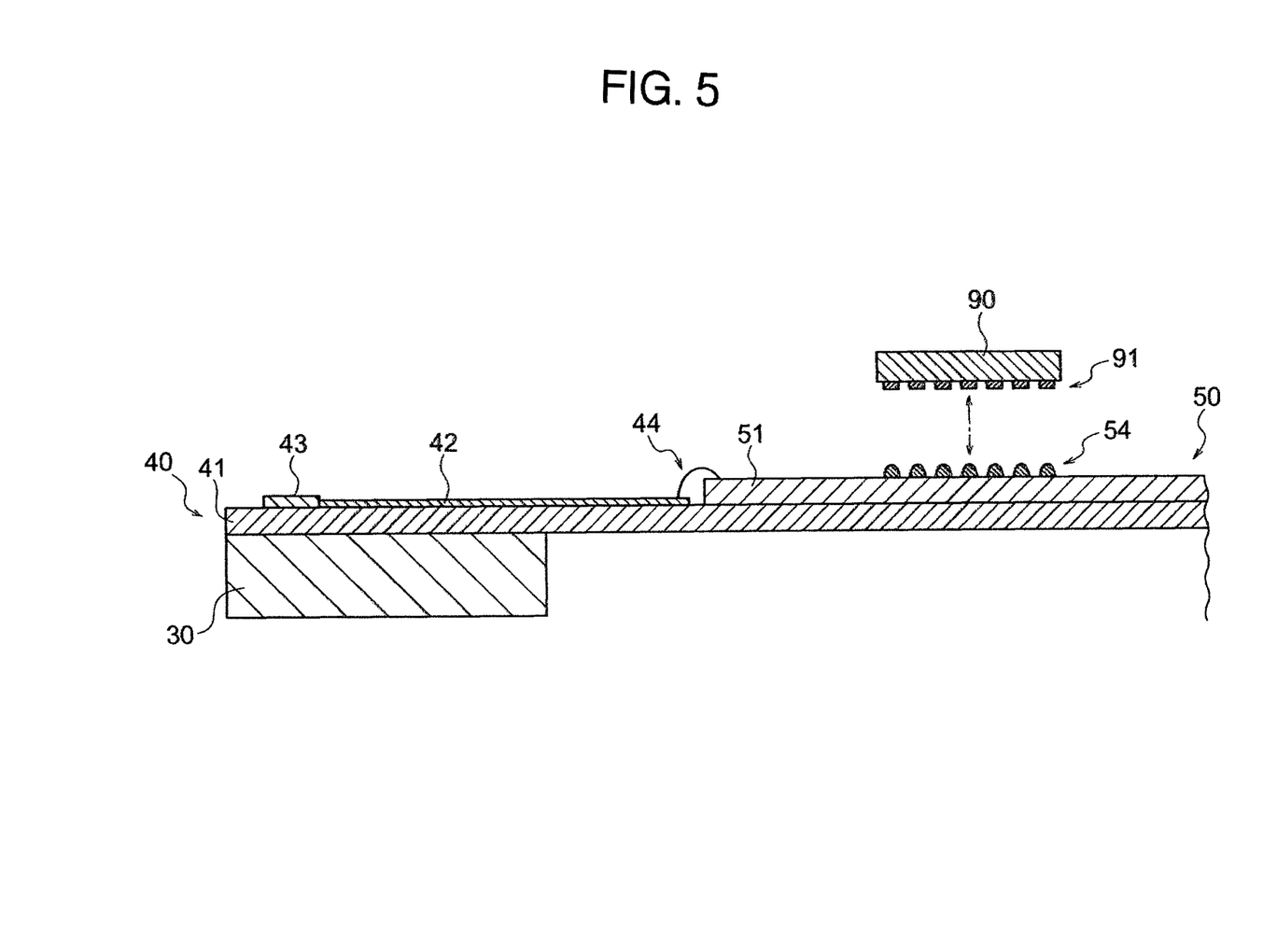
FIG. 5 is an enlarged view illustrating a V portion in FIG. 3.

As illustrated in FIG. 5, the base film 40 includes a film body 41, the wiring pattern 42 which is formed on the surface of the film body 41, and an external terminal 43. The film body 41 is, for example, a polyimide film. The wiring pattern 42 is formed by, for example, etching a copper film laminated on the film body 41.

The wiring pattern 42 is formed outside wiring lines 52 of the multi-layer board 50 in the direction along the surface which faces the cover member 60. As illustrated in FIG. 2, an adhesion portion of the surface of the base film 40 adheres to the multi-layer board 50 and the wiring pattern 42 is radially formed outside an adhesion portion. It is possible to ensure a distance between the wiring lines. Therefore, the wiring lines are formed the portion by the wiring pattern 42 on the base film.

As illustrated in FIG. 5, one end of the wiring pattern 42 is connected to the multi-layer board 50, by a wiring line, such as a bonding wire 44. The external terminal 43 is formed at the other end of the wiring pattern 42. When the electronic circuit formed in the die 90 is tested, a contactor (not illustrated) of the test apparatus comes into electrical contact with the external terminal 43 and the die 90 is electrically connected to the test device through the test carrier 10.

The wiring pattern 42 is not limited to the above-mentioned structure. Although not particularly illustrated in the drawings, for example, a portion of the wiring pattern 42 may be formed in real time on the surface of the base film 40 by an ink-jet printing method. Alternatively, the entire wiring pattern 42 may be formed by the ink-jet printing method.

The position of the external terminal 43 is not limited to the above-mentioned position. The external terminal 43 may be formed on the lower surface of the base film 40. The wiring pattern 42 according to the present embodiment corresponds to an example of a first wiring portion in the invention.

Although not particularly illustrated in the drawings, the wiring pattern or the external terminal may be formed on the cover film 80 or the external terminal may be formed on the cover frame 70, in addition to the base film 40.

A wiring line which is formed by a drawing method, such as an ink-jet method, may be used, instead of the bonding wire 44.

As illustrated in FIGS. 3 to 5, the multi-layer board 50 includes a board body 51, the wiring lines 52, resistive portions 53 and, the bumps 54. In the multi-layer board 50, insulators and the wiring lines 52 forming the board body 51 are stacked in a layer shape. The multi-layer board 50 is formed in a layer shape, unlike the base film 40. Therefore, the pattern of the wiring lines 52 is formed in the board body 51, as well as on the surface of the board body 51.

The wiring lines 52 are formed so as to correspond to each layer of the board body 51. One end of each wiring line 52 is connected to the bump 54 and the other end thereof is connected to the wiring pattern 42 through the bonding wire 44. The wiring lines 52 are formed so as to correspond to the number of measurement pins of the die 90. The multi-layer board 50 may be a flexible board in which the board body 51 is flexible or a rigid board. The wiring line 52 is made of a low-resistance material such as copper.

The resistive portion 53 is a high-resistance portion and is formed in a portion of the wiring line 52. The resistive portion 53 is formed such that the resistance value (a second resistance value in the invention) of the resistive portion 53 is higher than the resistance value (a first resistance value in the invention) of the wiring line 52. In addition, the length of the resistive portion 53 is sufficiently shorter than that of the wiring line 52. The influence of the resistive portion 53 on the signal which is transmitted from the test apparatus and passes through the wiring line 52 is reduced and it is possible to prevent the attenuation of the signal. When the resistance value is calculated, the length of the resistive portion 53 is sufficiently shorter than the wavelength of a radio-frequency signal so that the resistive portion 53 is treated as a lumped constant circuit rather than as a distributed constant circuit.

The resistive portion 53 is made of, for example, chrome or tantalum. In addition, the resistive portion 53 may be formed such that the resistance value thereof per unit length is higher than the resistance value of the wiring line 52 per unit length. The resistance value of the resistive portion 53 according to the present embodiment is an example of the first resistance value in the invention and the resistance value of the wiring line 52 is an example of the second resistance value in the invention.

Next, the relationship between the resistance value of the resistive portion 53 and the measurement pin will be described. In the test apparatus which tests the die 90, the maximum output power (rated power) is predetermined for each apparatus. When the die 90 is tested, a signal output is input to the pins of the die 90 through the wiring lines 52 such that output power is dispersed to each measurement pin. At that time, the lower limit (a lower limit voltage per pin) of the voltage of the signal output for testing the die 90 is predetermined in the range of, for example, 1.5 V to 2.0 V.

In order to achieve the test carrier 10 with multiple pins, a voltage that is equal to or higher than the lower limit needs to be input to each of the pints and power required for the test device increases. However, as described above, the rated power (upper limit power) of the test device is predetermined.

Therefore, in the present example, the current of each signal output is reduced while the voltage of the signal output to each pin is set to the lower limit or more, in order to reduce the power consumption of each pin. In the present example, the resistive portions 53 are provided in the multi-layer board 50 in order to reduce the current of each signal output.

The rated output of the test device is divided by the number of pins of the test carrier according to the present example to calculate the signal output to each pin. Since the lower limit voltage of the signal output to each pin is predetermined, the signal output to each pin is divided by the lower limit voltage to calculate a resistance value required for the resistive portion 53. That is, when the resistance value of the resistive portion 53 is set to the calculated resistance value or more, the power consumption of the test device is equal to or less than the rated power while the signal output to each pin is equal to or higher than the lower limit voltage. Therefore, it is possible to test the die 90 with multiple pins.

Accordingly, the resistance value of the resistive portion 53 is set depending on the rated power of the test apparatus and the number of pins which are electrical contacts between the die 90 and the test carrier 10. For the resistance value of the resistive portion 53, in order to ensure a margin of the output consumption of the test device, output power that is less than the rated power may be divided by the number of pins to calculate the signal output to each pin and a value obtained by dividing the calculated signal output by the lower limit voltage of the signal output may be used as the resistance value.

The resistive portion 53 is formed closer to the bump 54 than to the external terminal 43 which is electrically connected to one end of the wiring line 52 through the wiring pattern 42. Preferably, the resistive portion 53 may be formed in the wiring line 52 at a position that is closer to the other end of the wiring line 52 connected to the bump 54 than to the one end of the wiring line 52 connected to the wiring pattern 42. The resistive portion 53 may be formed at a position closer to the bump 54.

Unlike the present example, when the resistive portion 53 is formed at a position that is away from the bump 54, a signal deteriorates (is attenuated) due to a parasitic component of the wiring line 52 between the resistive portion 53 and the bump 54, which has an effect on the evaluation of the die 90. On the other hand, when the resistive portion 53 is formed close to the bump 54, it is possible to reduce the parasitic component. Therefore, it is possible to prevent the deterioration (attenuation) of the signal which is input from the bump 54 to the die 90. The resistive portion 53 according to the present embodiment is an example of a second wiring portion in the invention.

The bumps 54 are members for electrical connection between the multi-layer board 50 and the die 90 and are provided on the surface of the board body 51 so as to correspond to the arrangement of the electrode pads 91 of the die 90. The bump 54 is made of, for example, a conductive elastic material including copper or nickel and is formed by, for example, a semi-additive method. The bump 54 is connected to the one end of the wiring line 52 on the surface of the board body 51. The bump 54 according to the invention corresponds to an example of a contact portion in the invention.

As illustrated in FIGS. 2 to 4, the cover member 60 includes the cover frame 70 and the cover film 80. The cover member 60 according to the present embodiment corresponds to an example of a second member in the invention.

The cover frame 70 is a rigid plate that has high rigidity (has higher rigidity than at least the base film 40) and has the opening 71 formed at the center thereof. The cover frame 70 is made of, for example, glass, a polyimide resin, a polyamide-imide resin, a glass epoxy resin, or ceramics.

The cover film 80 in the present this embodiment is a film made of an elastic material that has a lower Young's modulus (lower hardness) than the base film 40 and has a self-adhesive property (stickiness) so as to be more flexible than the base film 40. As an example of the material forming the cover film 80 include silicon rubber or polyurethane is exemplified. The term "self-adhesive property" means a property that can adhere to an object, without using an adhesive or bond.

Both the cover film 80 and the base film 40 may have the self-adhesive property.

Returning to FIGS. 2 to 4, the cover film 80 is stuck to the entire surface of the cover frame 70 including the central opening 71 by an adhesive (not illustrated). In the present embodiment, since the flexible cover film 80 is stuck to the cover frame 70 with high rigidity, the handling ability of the cover member 60 is improved.

The test carrier 10 that is explained above is assembled as follows.

That is, first, the cover member 60 is reversed and the die 90 is placed on the cover film 80, in a status that the electrode pad 91 are upward. When the base film 40 has the self-adhesive property, the die 90 is placed on the multi-layer board 50.

At that time, in the present embodiment, as described above, since the cover film 80 has the self-adhesive property, it is possible to temporarily fix the die 90 to the cover film 80 only by placing the die 90 on the cover film 80.

Then, the base member 20 overlaps the cover member 60 such that the die 90 is accommodated in an accommodation space which is formed between the base film 40 and the multi-layer board 50, and the cover film 80. Thereby, the die 90 is interposed therebetween.

At that time, in the present embodiment, since the cover film 80 has the self-adhesive property, the base member 20 and the cover member 60 are stuck to each other only by contact therebetween, the base film 40 and the cover film 80 and are integrated with each other.

In the present embodiment, the cover film 80 is more flexible than the base film 40 and the tension of the cover film 80 is increased by a value corresponding to the thickness of the die 90. The die 90 is pressed against the base film 40 by the tension of the cover film 80. Therefore, it is possible to prevent the positional deviation of the die 90.

A resin layer, such as a resist layer, may be formed on a portion of the base film 40 in which the wiring pattern 42 is formed. In this case, since the unevenness due to the wiring pattern 42 is reduced, the bonding between the base film 40 and the cover film 80 is strengthened.

The assembled test carrier 10 is carried to the test apparatus which is not particularly illustrated. The contactor of the test apparatus comes into electrical contact with the external terminal 43 of the test carrier 10 and the electronic circuit of the die 90 is electrically connected to the test apparatus through the test carrier 10. The electronic circuit of the die 90 is tested.

As a modification of the invention, the bump 54 may have high resistance like the resistive portion 53. The resistance value of the bump 54 is set by adjusting the amount of conductive material included in the bump 54. Similarly to the resistive portion 53, the resistance value of the bump 54 is set depending on the rated power of the test apparatus and the number of pins which are electrical contacts between the die 90 and the test carrier 10. Therefore, it is possible to reduce the power consumption of each pin and to achieve the test carrier 10 which responds to an increase in the number of pins.

In the present example, the multi-layer board 50 may be provided with a noise filter for suppressing noise which has an effect on a test signal. The noise filter is formed by a circuit including, for example, a capacitor. As described above, since the test carrier 10 includes the multi-layer board 50, a circuit function can be given to the multi-layer board 50. As an example of the circuit function, the noise filter is provided in the multi-layer board 50. The noise filter according to this embodiment corresponds to an example of a noise suppression portion.

The noise filter is formed in the wiring line 52 at a position that is closer to the bump 54 than to the external terminal 43 which is connected to one end of the wiring line 52 through the wiring pattern 42. Preferably, the resistive portion 53 may be formed in the wiring line 52 at a position that is closer to the other end of the wiring line 52 connected to the bump than to the one end of the wiring line 52 connected to the wiring pattern 42. In this case, the noise filter can be arranged in the vicinity of the die 90 and it is possible to improve the effect of suppressing noise.

Note that, the multi-layer board 50 is not necessarily defined to the above-mentioned size. The multi-layer board 50 may be placed on the base frame 30, instead of the base film 40. In addition, when the wiring pattern 42 formed on the surface of the base film 40 can respond to a number of pins of the die 90, the multi-layer board 50 may be omitted.

Note that, the above-mentioned embodiments explained above are described for facilitating understanding of the present invention and are not limiting the present invention. Therefore, the elements disclosed in the above embodiment include all design modification and equivalents falling under the technical scope of the present invention.

EXPLANATIONS OF LETTERS OR NUMERALS

10 TEST CARRIER
20 BASE MEMBER
30 BASE FRAME
40 BASE FILM
41 FILM BODY
42 WIRING PATTERN
43 EXTERNAL TERMINAL
44 BONDING WIRE
50 MULTI-LAYER BOARD
51 BOARD BODY
52 WIRING
53 RESISTIVE PORTION
54 BUMP
60 COVER MEMBER
70 COVER FRAME
71 OPENING
80 COVER FILM
90 DIE
91 ELECTRODE PAD

The invention claimed is:

1. A test carrier comprising:
a base that holds an electronic device to be tested; and
a cover that overlaps the base so as to cover the electronic device to be tested, wherein:
the base includes a board having a wiring line that is electrically connected to the electronic device to be tested, and further includes an electrical contact between the electronic device to be tested and the test carrier,
the wiring line includes a first wiring portion that has a first predetermined resistance value and a second wiring portion that has a second resistance value higher than the first resistance value, and
one end of the first wiring portion is connected to the electrical contact.

2. The test carrier according to claim 1, wherein:
the electrical contact includes one or more electrical contacts;
the second resistance value is set depending on a predetermined upper limit output of a test apparatus that tests the electronic device to be tested and the number of the one or more electrical contacts.

3. The test carrier according to claim 1,
wherein the base includes an external terminal that is electrically connected to one end of the wiring line, and
the second wiring portion is formed closer to an electrical contact portion between the electronic device to be tested and the base than to the external terminal.

4. The test carrier according to claim 1,
wherein the base includes a plurality of contact portions that come into electrical contact with the electronic device to be tested, and
a resistance value of the contact portions is set depending on a predetermined upper limit output of a test device that tests the electronic device to be tested and the number of electrical contacts between the electronic device to be tested and the base.

5. The test carrier according to claim 4,
wherein the contact portions are made of a conductive elastic material, and
the resistance value is adjusted by the content of the elastic material.

6. The test carrier according claim 1,
wherein the board of the base is a multi-layer board.

7. The test carrier according to claim 1,
wherein the board of the base includes a noise suppression portion that suppresses noise.

8. The test carrier according to claim 7,
wherein the base includes an external terminal that is electrically connected to the one end of the wiring line, and
the noise suppression portion is formed closer to an electrical contact portion between the electronic device to be tested and the base than to the external terminal.

* * * * *